(12) United States Patent
Diehl et al.

(10) Patent No.: US 11,691,573 B2
(45) Date of Patent: Jul. 4, 2023

(54) AERODYNAMICALLY ENHANCED SENSOR HOUSING

(71) Applicant: Pony AI Inc., Grand Cayman (KY)

(72) Inventors: Peter G. Diehl, Shanghai (CN); Cyrus F. Abari, San Bruno, CA (US)

(73) Assignee: Pony AI Inc., Grand Cayman (KY)

( * ) Notice: Subject to any disclaimer, the term of this patent is extended or adjusted under 35 U.S.C. 154(b) by 399 days.

(21) Appl. No.: 16/822,451

(22) Filed: Mar. 18, 2020

(65) Prior Publication Data

US 2021/0291748 A1    Sep. 23, 2021

(51) Int. Cl.
| | | |
|---|---|---|
| *B60R 11/04* | (2006.01) | |
| *B62D 35/00* | (2006.01) | |
| *B60R 11/00* | (2006.01) | |
| *G05D 1/00* | (2006.01) | |
| *G06F 30/15* | (2020.01) | |

(52) U.S. Cl.
CPC .............. *B60R 11/04* (2013.01); *B62D 35/00* (2013.01); *B60R 2011/004* (2013.01); *B60R 2011/0085* (2013.01); *G05D 1/0088* (2013.01); *G06F 30/15* (2020.01)

(58) Field of Classification Search
CPC .............. B60R 11/04; B60R 2011/004; B60R 2011/0085; B62D 35/00; G06F 30/15; G05D 1/0088
See application file for complete search history.

(56) References Cited

U.S. PATENT DOCUMENTS

| | | | |
|---|---|---|---|
| 4,810,022 A * | 3/1989 | Takagi ................. | B62D 35/005 296/180.5 |
| 4,904,015 A * | 2/1990 | Haines ................. | B62D 35/001 296/180.3 |
| 5,796,612 A * | 8/1998 | Palmer .................. | B64D 43/02 701/4 |
| 9,394,011 B1 * | 7/2016 | Hanagan ................ | B62D 35/00 |
| 10,071,773 B2 * | 9/2018 | Williams ............... | B62D 35/00 |
| 10,611,479 B1 * | 4/2020 | Ivans ........................ | B64C 7/00 |
| 2013/0210563 A1 * | 8/2013 | Hollinger ........... | H04N 5/23229 473/570 |

(Continued)

FOREIGN PATENT DOCUMENTS

| | | | | |
|---|---|---|---|---|
| CN | 103446716 A | * | 12/2013 | ......... A63B 37/0003 |
| DE | 202019105104 U1 | * | 11/2019 | ......... F16H 25/2015 |

(Continued)

*Primary Examiner* — Lori L Lyjak

(57) ABSTRACT

Described herein are aerodynamically enhanced sensor housings. An aerodynamically enhanced sensor housing has an asymmetrical lateral cross-section that includes a first portion having a substantially spherical curvature and a second portion having a non-spherical curvature. The second portion having the non-spherical curvature may be elongated in relation to the first portion. An aerodynamically enhanced housing can also include one or more indentations formed in an exterior surface thereof to further enhance drag reducing characteristics of the housing. In addition, air flow characteristics around the sensor housing during vehicle operation can be assessed and a drag reduction protocol can be generated and implemented to further enhanced the drag reducing characteristics of the sensor housing.

19 Claims, 9 Drawing Sheets

(56) References Cited

U.S. PATENT DOCUMENTS

| | | | | |
|---|---|---|---|---|
| 2013/0250047 A1* | 9/2013 | Hollinger | ............... | H04N 7/183 |
| | | | | 348/36 |
| 2013/0283928 A1* | 10/2013 | Wiklund | ................ | G01K 1/08 |
| | | | | 73/866.5 |
| 2017/0274991 A1* | 9/2017 | Shiosaki | ................ | B64C 11/46 |
| 2018/0164439 A1* | 6/2018 | Droz | ....................... | G01S 17/89 |
| 2020/0331403 A1* | 10/2020 | Smith | ....................... | B60R 1/00 |
| 2021/0386260 A1* | 12/2021 | Horn | ....................... | A47L 11/00 |
| 2022/0087767 A1* | 3/2022 | Chien | .................... | A61B 50/31 |

FOREIGN PATENT DOCUMENTS

| | | | | | |
|---|---|---|---|---|---|
| EP | | 0667708 A1 * | 8/1995 | ........... | H04N 5/2252 |
| WO | WO-2018071970 A1 * | | 4/2018 | ............. | B64C 27/08 |

\* cited by examiner

AERODYNAMICALLY ENHANCED SENSOR HOUSING

The present invention relates generally to a sensor housing, and more particularly, in some embodiments, to a sensor housing with enhanced aerodynamic characteristics.

BACKGROUND

On-board sensors in a vehicle, such as an autonomous or driverless vehicle, supplement and bolster the vehicle's field-of-view (FOV) by providing continuous streams of sensor data captured from the vehicle's surrounding environment. Sensor data is used in connection with a diverse range of vehicle-based applications including, for example, blind spot detection, lane change assisting, rear-end radar for collision warning or collision avoidance, park assisting, cross-traffic monitoring, brake assisting, emergency braking, and automated distance control.

On-board vehicle sensors can include, for example, cameras, light detection and ranging (LiDAR) systems, radar systems, Global Positioning System (GPS) receivers, sonar-based sensors, ultrasonic sensors, inertial measurement units (IMUs), accelerometers, gyroscopes, magnetometers, far-infrared (FIR) sensors, or the like. Some sensors can be provided on an exterior of a vehicle, in which case, they are typically provided in a housing designed to protect the sensor from damage due to exposure to the elements. In some scenarios, a sensor housing provided on an exterior of a vehicle such as a roof of a vehicle may be subjected to forces during vehicle operation that can negatively impact vehicle operation. Discussed herein are technical solutions that address technical drawbacks associated with conventional sensor housings.

SUMMARY

In an example embodiment, a sensor assembly apparatus provided onboard a vehicle is disclosed. The apparatus includes one or more sensors and a housing containing the one or more sensors. The housing includes an asymmetrical lateral cross-section, and the asymmetrical lateral cross-section defines a first portion of the housing having a substantially spherical curvature and a second portion of the housing having a non-spherical curvature.

In an example embodiment, the second portion of the housing having the non-spherical curvature includes an elongated portion that opposes a spherical portion of the first portion of the housing. In an example embodiment, a length of the elongated portion is inversely proportional to an amount of drag on the housing.

In an example embodiment, an exterior surface of the housing includes one or more indentations formed therein. In an example embodiment, the one or more indentations include multiple indentations that provide substantially complete coverage across the exterior surface of the housing.

In an example embodiment, the one or more indentations include a first indentation and a second indentation such that at least one of a width or a depth of the first indentation is greater than a width or a depth of the second indentation.

In an example embodiment, the one or more indentations further include a third indentation having substantially the same width and depth as the second indentation such that the second indentation and the third indentation form a cluster around the first indentation.

In an example embodiment, the first portion of the housing having the substantially spherical curvature is aligned with a direction of travel of the vehicle.

In an example embodiment, the housing is adapted to rotate about an axis and a rotational speed of the housing is based at least in part on air flow characteristics associated with air impinging on an exterior surface of the housing. In an example embodiment, the air flow characteristics comprise at least one of a level of air flow disruption of the impinging air on one or more portions of the exterior surface of the housing or a direction of impingement of the impinging air.

In an example embodiment, a computer-implemented method for reducing drag on a sensor housing includes determining air flow characteristics of air impinging on an exterior surface of the sensor housing and determining that the air flow characteristics fail to satisfy one or more drag reduction criteria. The method further includes generating a drag reduction protocol designed to modify the air flow characteristics and reduce the drag on the sensor housing to satisfy the one or more drag reduction criteria and implementing the drag reduction protocol.

In an example embodiment, the air flow characteristics include at least one of a level of air flow disruption of the impinging air on one or more portions of the exterior surface of the housing or a direction of impingement of the impinging air.

In an example embodiment, determining that the air flow characteristics fail to satisfy one or more drag reduction criteria includes determining the level of air flow disruption is greater than a threshold level of permissible air flow disruption. In another example embodiment, determining that the air flow characteristics fail to satisfy one or more drag reduction criteria includes determining that the direction of impingement of the impinging air exceeds a threshold angle.

In an example embodiment, generating the drag reduction protocol includes determining at least one of a modified rotational speed of the sensor housing or a modified relative positioning of the sensor housing with respect to a reference point on the vehicle to reduce the drag on the sensor housing.

In an example embodiment, the sensor housing includes an asymmetrical lateral cross-section, and wherein the asymmetrical lateral cross-section defines a first portion of the sensor housing having a substantially spherical curvature and a second portion of the sensor housing having a non-spherical curvature.

In an example embodiment, a system for reducing drag on a sensor housing is disclosed. The system includes at least one processor and at least one memory storing computer-executable instructions. The at least one processor is configured to access the at least one memory and execute the computer-executable instructions to perform a set of operations. In an example embodiment, the set of operations includes determining air flow characteristics of air impinging on an exterior surface of the sensor housing and determining that the air flow characteristics fail to satisfy one or more drag reduction criteria. The set of operations further includes generating a drag reduction protocol designed to modify the air flow characteristics and reduce the drag on the sensor housing to satisfy the one or more drag reduction criteria and implementing the drag reduction protocol.

In an example embodiment, the air flow characteristics include at least one of a level of air flow disruption of the impinging air on one or more portions of the exterior surface of the housing or a direction of impingement of the impinging air.

In an example embodiment, determining that the air flow characteristics fail to satisfy one or more drag reduction criteria includes at least one of: determining the level of air flow disruption is greater than a threshold level of permissible air flow disruption or determining that the direction of impingement of the impinging air exceeds a threshold angle.

In an example embodiment, generating the drag reduction protocol includes determining at least one of a modified rotational speed of the sensor housing or a modified relative positioning of the sensor housing with respect to a reference point on the vehicle to reduce the drag on the sensor housing.

In an example embodiment, a computer program product is provided for reducing drag on a sensor housing. The computer program product includes computer-readable storage media storing computer-executable/machine-readable instructions that, when executed by one or more processing units, causes a method to be performed that includes determining air flow characteristics of air impinging on an exterior surface of the sensor housing and determining that the air flow characteristics fail to satisfy one or more drag reduction criteria. The method further includes generating a drag reduction protocol designed to modify the air flow characteristics and reduce the drag on the sensor housing to satisfy the one or more drag reduction criteria and implementing the drag reduction protocol. In example embodiments, the computer-readable storage media of the above-described computer program product further stores computer-executable/machine-readable instructions that, when executed by one or more processing units, further causes any of the operations/functions and any of the additional features/aspects of example embodiments of the invention described above in relation to example computer-implemented methods of the invention to be performed.

These and other features of the systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

DETAILED DESCRIPTION

Overview

Figure 1:
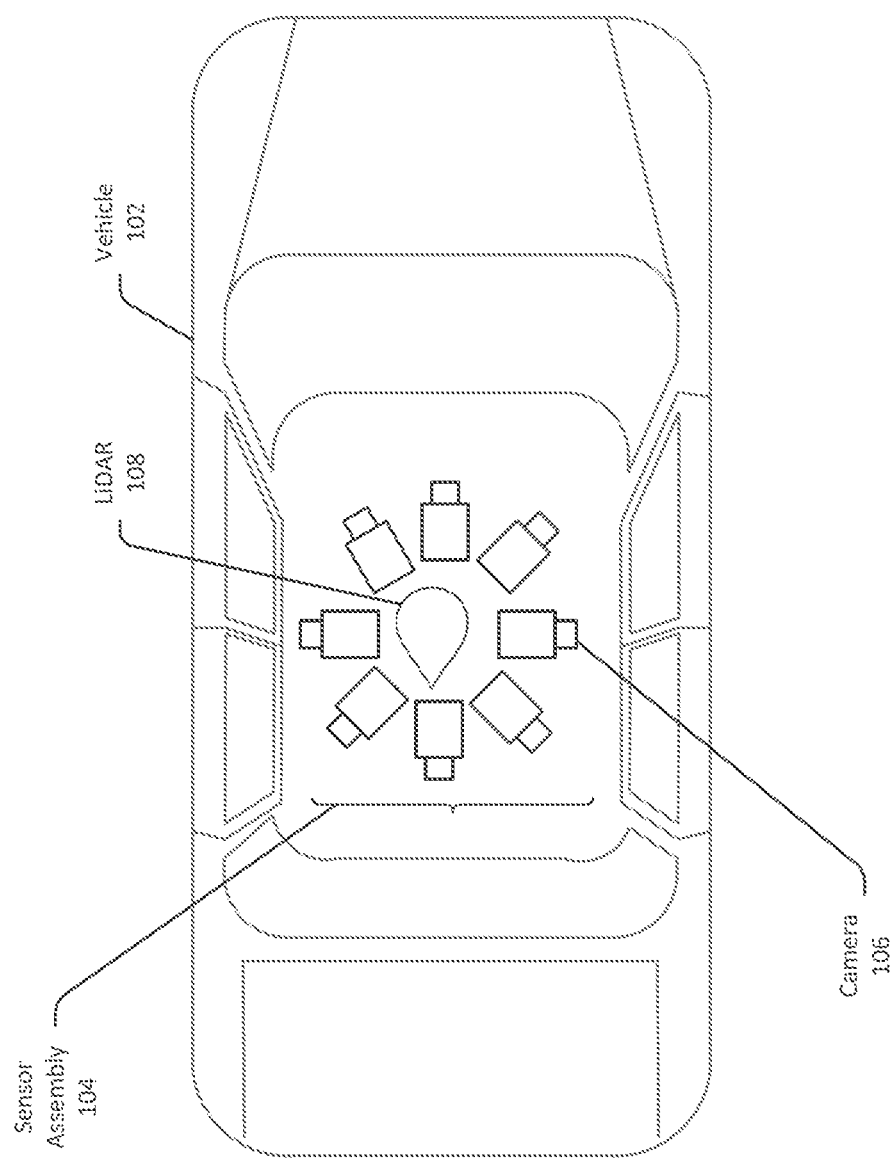
FIG. 1 illustrates an aerial view of a sensor assembly in accordance with an example embodiment of the invention.

In the following description, certain specific details are set forth in order to provide a thorough understanding of various embodiments of the invention. However, one skilled in the art will understand that the invention may be practiced without these details. Moreover, while various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way.

Unless the context requires otherwise, throughout the present specification and claims, the word "comprise" and variations thereof, such as, "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it were individually recited herein. Additionally, the singular forms "a," "an" and "the" include plural referents unless the context clearly dictates otherwise. The phrases "at least one of," "at least one selected from the group of," or "at least one selected from the group consisting of," and the like are to be interpreted in the disjunctive (e.g., not to be interpreted as at least one of A and at least one of B).

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment, but may be in some instances.

Furthermore, the particular features, structures, or characteristics may be combined in any suitable manner in one or more embodiments.

In general, a vehicle (e.g., an autonomous vehicle, a driverless vehicle, etc.) can have a myriad of sensors onboard the vehicle. Such sensors can be disposed on an exterior or in an interior of a vehicle and can include, without limitation, LiDAR sensors, radars, cameras, GPS receivers, sonar-based sensors, ultrasonic sensors, IMUs, accelerometers, gyroscopes, magnetometers, FIR sensors, and so forth. Such sensors play a central role in the functioning and operation of an autonomous or driverless vehicle. For example, LiDARs can be utilized to detect objects (e.g., other vehicles, road signs, pedestrians, buildings, etc.) in an environment around a vehicle. LiDARs can also be utilized to determine relative distances between objects in the environment and between objects and the vehicle. As another non-limiting example, radars can be utilized in connection with collision avoidance, adaptive cruise control, blind spot detection, assisted parking, and other vehicle applications. As yet another non-limiting example, cameras can be utilized to recognize, interpret, and/or identify objects captured in images or visual cues of the objects. Cameras and other optical sensors can capture image data using charge coupled devices (CCDs), complementary metal oxide semiconductors (CMOS), or similar elements.

Data collected from these sensors can be processed and used, as inputs, to algorithms configured to make various autonomous driving decisions including decisions relating to when and how much to accelerate, decelerate, change direction, or the like. More particularly, the myriad of sensors previously described (e.g., LiDARs, radars, cameras, etc.) provide continuous streams of sensor data that are provided as input to algorithms that perform complex calculations in order to facilitate a multitude of operations required for safe autonomous vehicle operation such as object detection, object classification, object tracking, collision avoidance, vehicle navigation, vehicle acceleration and deceleration, and the like.

Onboard vehicle sensors are typically provided within a housing, particularly sensors that are disposed on an exterior of the vehicle. For sensors provided on an exterior of a vehicle, the housing in which they are contained serves to protect the sensors from damage that may otherwise result from exposure to the natural elements. For example, LiDARS, cameras, radars, and so forth may be contained within protective housing that protects the sensors from damage due to rain, wind, heat, or the like.

In some cases, certain sensors (and the housing in which they are provided) may be disposed on an exterior part of a vehicle that experiences significant wind forces during vehicle operation, particularly at high speeds. For instance, a LiDAR assembly may be provided on top of a roof of a vehicle in order to facilitate the capture of a 360 degree, unobstructed field-of-view (FOV) around the vehicle. In such a position in relation to the vehicle, the LiDAR assembly is likely to experience significant (if not the strongest) wind forces during vehicle operation. In particular, the LiDAR assembly may encounter significant air resistance during vehicle operation depending on its placement on the vehicle, which may contribute to drag on the vehicle, and which may, in turn, exacerbate fuel consumption by the vehicle. In addition, the air resistance encountered by the sensor housing may produce undesirable and potentially damaging forces on the mechanical system of the sensor.

Conventional sensor housing such as that used to house a LiDAR, for example, typically has a spherical curvature. The spherical curvature, in turn, produces a lateral cross-section of the housing that is symmetrical. For instance, the lateral cross-section of a typical spherical housing would be a circular cross-section. While a spherical housing curvature does serve to reduce drag on the housing as compared to, for example, a flat surface, the spherical housing still results in a significant amount of drag on the housing and a considerable amount of air flow disruption as air travels around the housing. This results in the technical problem poor vehicle fuel consumption due to the increased drag/air resistance on the sensor housing (and thus the vehicle overall). In addition, the current solely spherical curvature of sensor housings can produce excessive wind noise that may be disruptive to vehicle occupants.

Various embodiments of the invention overcome technical problems specifically arising in the realm of computer-based technology, and more specifically, in the realm of autonomous vehicle technology. In particular, example embodiments of the invention provide technical solutions to the above-described technical problems in the form of apparatuses, methods, systems, computer program products, techniques, and methodologies for providing a sensor housing with enhanced aerodynamic characteristics. More specifically, in example embodiments, a sensor housing is provided that includes an asymmetrical lateral cross-section. In example embodiments, the asymmetrical lateral cross-section includes a first portion of the housing that has a substantially spherical curvature and a second portion of the housing that has a non-spherical curvature. In addition, in example embodiments, the sensor housing may have one or more indentations formed in an exterior surface of the sensor housing. The indentations may vary in size and may be grouped to form clusters on the surface of the housing. The indentations may serve to even further reduce the amount of drag on the sensor housing.

This asymmetrical characteristic of a sensor housing in accordance with example embodiments of the invention serves to significantly reduce drag on the housing as compared to conventional sensor housings that possess exclusively a spherical curvature. This substantial reduction in drag on the sensor housing, and thus on the vehicle overall, yields a marked improvement in fuel consumption of the vehicle. Thus, the enhanced aerodynamic characteristics of a sensor housing in accordance with example embodiments of the invention provides a technical solution to the technical problem of excessive drag (and thus poorer fuel consumption) that conventional sensor housings experience. In addition, an aerodynamically enhanced sensor housing in accordance with example embodiments of the invention results in a substantial reduction in wind noise, and thus, provides a technological improvement that enhances the experience of the vehicle occupant.

In addition, example embodiments of the invention also relate to a method (and corresponding system and computer program product) for reducing drag on a sensor housing is disclosed. The method includes determining air flow characteristics of air impinging on an exterior surface of the sensor housing and determining that the air flow characteristics fail to satisfy one or more drag reduction criteria. The method further includes generating a drag reduction protocol designed to modify the air flow characteristics and reduce the drag on the sensor housing to satisfy the one or more drag reduction criteria and implementing the drag reduction protocol. The above-described example method provides a further technical solution to the technical problem experienced by conventional sensor housing of excessive drag and poorer resulting vehicle fuel consumption by detecting air flow characteristics of air impinging on the sensor housing that are increasing drag, and generating and implementing a drag reduction protocol to decrease the amount of drag, and thus, improve fuel consumption.

Illustrative Embodiments

FIG. 1 illustrates an aerial view of a sensor assembly apparatus 104 in accordance with an example embodiment of the invention. The sensor assembly apparatus 104 may include a variety of different types of sensors including, for example, one or more LiDAR sensors 108 and one or more cameras 106. Although not depicted in FIG. 1, the sensor assembly apparatus 104 may further include other types of sensors such as, for example, one or more IMUs, one or more GPS receivers, and so forth. In the example configuration depicted in FIG. 1, the LiDAR sensor 108 is centrally located on a roof of a vehicle 102 and is surrounded by multiple cameras that are positioned circumferentially around the LiDAR sensor 108. While the sensor assembly apparatus 104 is illustratively depicted in FIG. 1 as including a LiDAR 108 having its own housing, with multiple cameras located circumferentially around the LiDAR 108, each within its own housing, it should be appreciated that other configurations are within the scope of embodiments of the invention. For instance, in some example embodiments, one or more of the cameras 106 may be provided within a same housing as the LiDAR 108. Moreover, in some example embodiments, other sensor(s) may also be provided within the aerodynamically enhanced housing for the LiDAR including, without limitation, an inertial sensor, a temperature sensor, a moisture sensor, or the like.

In example embodiments, the LiDAR sensor 108 may periodically rotate through a horizontal and/or vertical scan path during which the LiDAR 108 may illuminate objects in the scanned environment with pulses of light and measure the differences in flight times and wavelengths for light that is reflected back to detect the presence of target objects, determine distances between the vehicle 102 and the target objects, determine distances between various target objects, and the like. The LiDAR 108 may generate digital three-dimensional (3D) representations of targets that were illuminated by the light pulses. In particular, the LiDAR sensor 108 may generate a 3D point cloud (a set of data points in space) representative of target objects that it has illuminated with light during its scan path.

In example embodiments, the LiDAR 108 may have an aerodynamically enhanced shape that reduces drag on the LiDAR housing. In particular, as will be described in more detail later in this disclosure in reference, for example, to FIGS. 2B and 2C, an aerodynamically enhanced sensor housing in accordance with example embodiments has a first portion having a substantially spherical curvature and a second portion having a non-spherical curvature. More specifically, a lateral cross-section of an aerodynamically enhanced sensor housing in accordance with example embodiments includes a first portion having a substantially spherical curvature and a second portion having a non-spherical curvature.

Figure 2A:
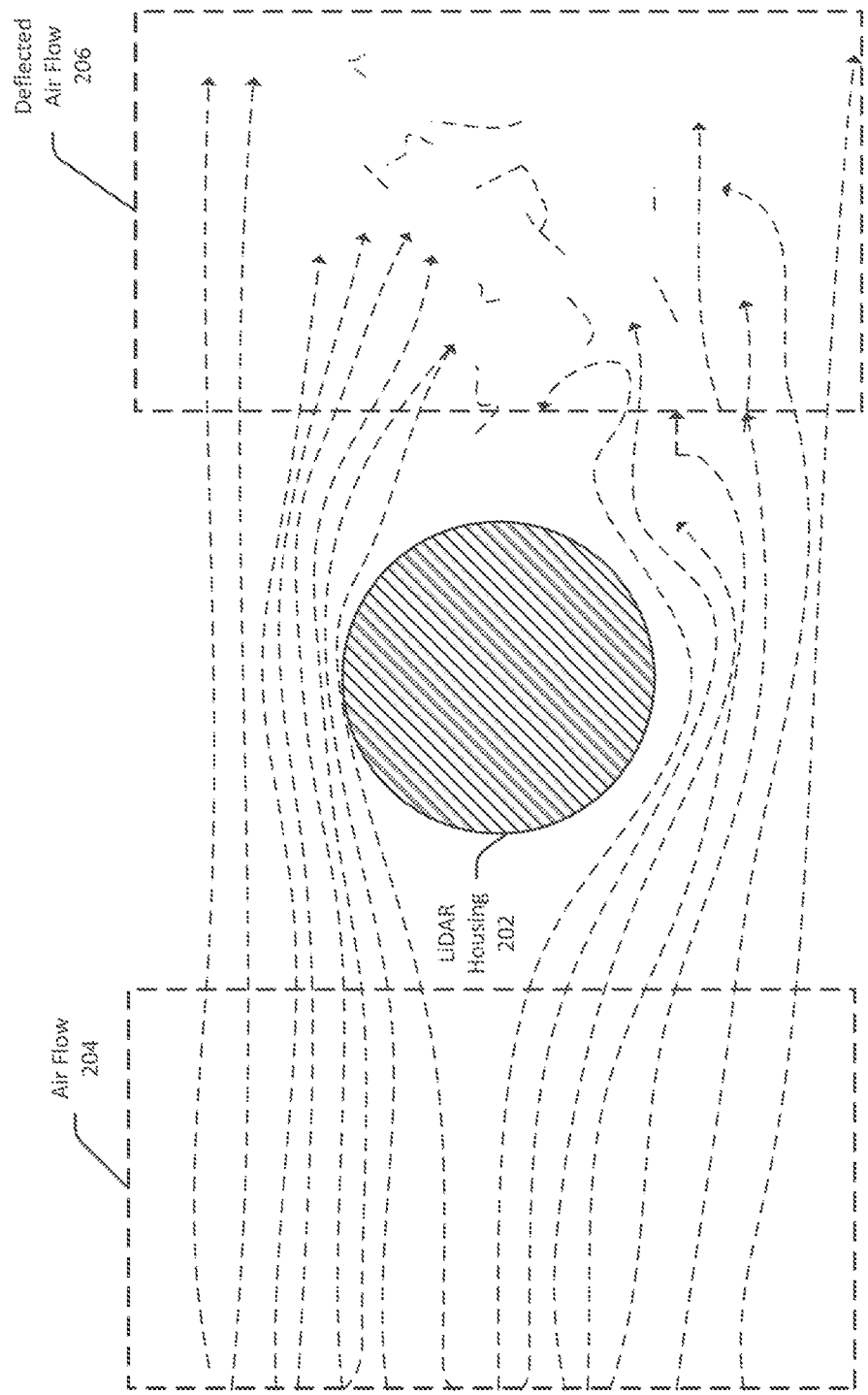
FIG. 2A illustrates disruption in air flow that occurs as air travels around a conventional sensor housing having a symmetrical lateral cross-section.

As previously described, an aerodynamically enhanced sensor housing in accordance with example embodiments experiences significantly reduced drag forces (forces due to air resistance) as compared to conventional fully spherical sensor housing. FIG. 2A illustrates disruption in air flow that occurs as air travels around a conventional sensor housing having a symmetrical lateral cross-section. While FIG. 2A as well as subsequent Figures describe sensor housings that are housings for LiDAR sensors, it should be appreciated that the example embodiments described herein—in particular, the example shapes/configurations for aerodynamically enhanced sensor housings described herein—are applicable to any sensor housing that can be mounted somewhere on an exterior of a vehicle and which may contain any number and/or type of sensors.

As shown in FIG. 2A, the LiDAR housing 202 is a conventional sensor housing having a fully spherical curvature. More specifically, a lateral cross-section of the housing 202 (as depicted in FIG. 2A) is symmetric and circular. As a result of the curvature of the housing 202, air flow 204 that impinges on the surface of the housing 202 results in deflected air flow 206. It can be assumed that a direction of the air flow 204 is in substantially direct opposition to a direction of travel of a vehicle on which the LiDAR housing 202 is provided. As depicted in FIG. 2A, the amount of disruption observed in the deflected air flow 206 that results from the air flow 204 passing by the LiDAR housing 202, while not as great as that which would be experienced if the air flow 204 were to contact a flat surface, is nonetheless significant. In certain example embodiments, the fully spherical curvature of the LiDAR housing 202 may produce a 50% reduction in drag/air resistance as compared to a flat surface.

Figure 2B:
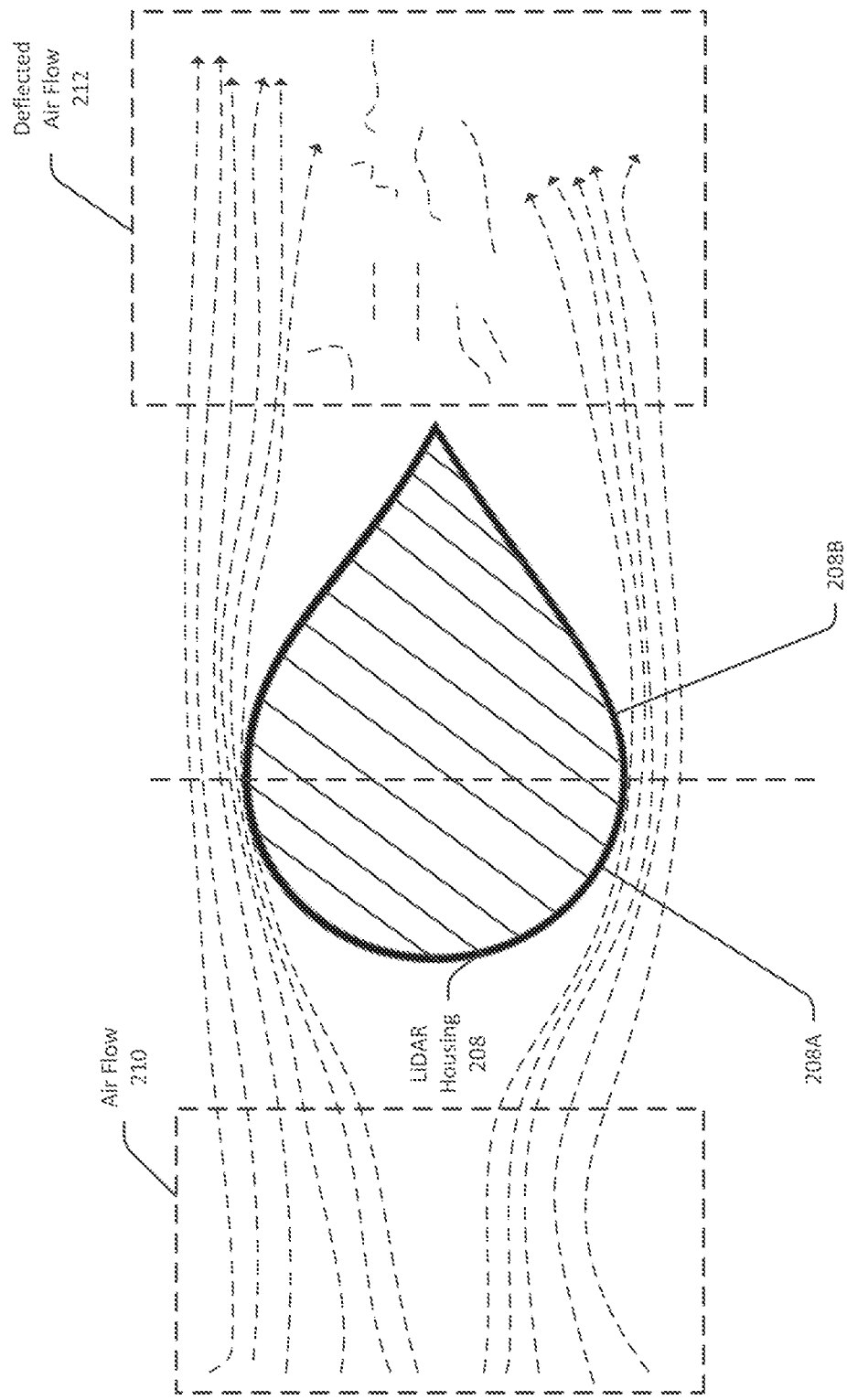
FIG. 2B illustrates reduced disruption in air flow that occurs as air travels around an aerodynamically enhanced sensor housing having an asymmetrical lateral cross-section in accordance with an example embodiment of the invention.

FIG. 2B illustrates reduced disruption in air flow that occurs as air travels around an aerodynamically enhanced sensor housing having an asymmetrical lateral cross-section in accordance with an example embodiment of the invention. As depicted in FIG. 2B, the LiDAR housing 208 has an aerodynamically enhanced physical configuration according to which a first portion 208A of the housing 208 has a substantially spherical curvature and a second portion 208B of the housing 208 has a non-spherical curvature. More specifically, a lateral cross-section of the housing 208 as shown in FIG. 2B is asymmetrical with the first portion 208A of the asymmetrical cross-section having a substantially spherical/circular curvature and the second portion 208B of the asymmetrical cross-section having a non-spherical curvature. For example, the second portion 208B is an elongated portion of the housing 208 as compared to the first portion 208A.

In example embodiments, air flow 210 may travel past an exterior surface of the aerodynamically enhanced sensor housing 208. Due to the asymmetrical configuration of the housing 208 according to which the housing 208 includes a first portion 208A that has a spherical curvature and a second portion 208B that has a non-spherical curvature, the air flow 210 experiences significantly less disruption as it travels past the housing 208 as compared to the conventional sensor housing 202, for example. As a result, more of the air flow 210 remains intact and experiences less disruption as it becomes deflected air flow 212. As used herein, less disruption to an incoming air flow (e.g., air flow 210) may indicate less turbulence in the deflected air flow (e.g., deflected air flow 212). Less disruption to the air flow 210/less turbulence in the deflected air flow 212 is indicative of less drag/air resistance on the housing 208. In an example embodiment, the aerodynamically enhanced sensor housing 208 having an asymmetrical lateral cross-section configuration may result in greater than a 50% reduction in the air resistance experience by the housing 208 as compared to the air resistance experienced by the conventional sensor housing 202.

Figure 2C:
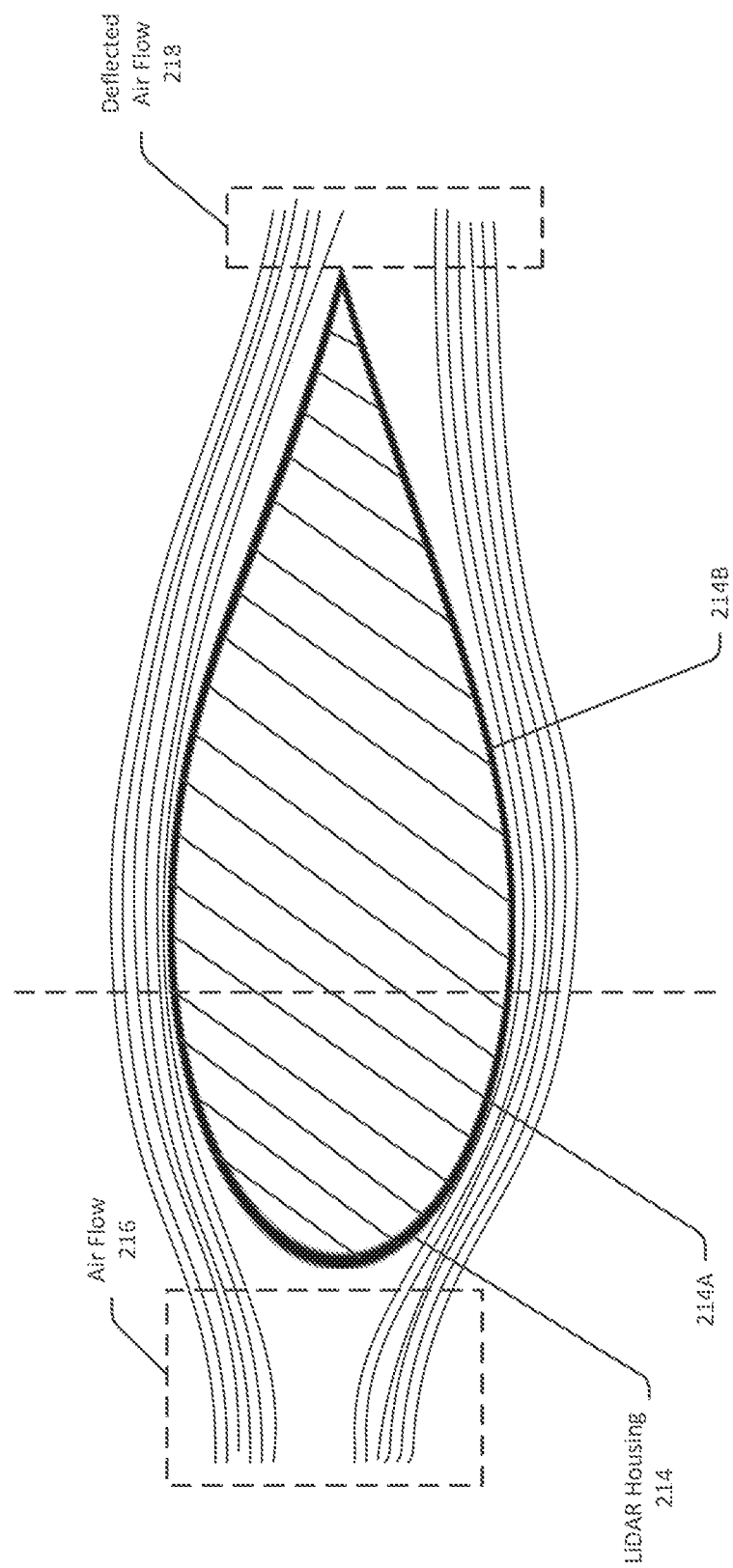
FIG. 2C illustrates even further reduced disruption in air flow that occurs as air travels around an aerodynamically enhanced sensor housing having an asymmetrical lateral cross-section in accordance with another example embodiment of the invention.

FIG. 2C illustrates even further reduced disruption in air flow that occurs as air travels around an aerodynamically enhanced sensor housing having an asymmetrical lateral cross-section in accordance with another example embodiment of the invention. In particular, FIG. 2C depicts an aerodynamically enhanced sensor housing 214 that provides an even further reduction in air resistance as compared to the housing 208 of FIG. 2B in accordance with example embodiments of the invention. As shown in FIG. 2C, the LiDAR housing 214 has an aerodynamically enhanced physical configuration according to which a first portion 214A of the housing 214 has a substantially spherical curvature and a second portion 214B of the housing 214 has a non-spherical curvature. More specifically, a lateral cross-section of the housing 214 as shown in FIG. 2C is asymmetrical, where the first portion 214A of the asymmetrical cross-section has a substantially spherical/circular curvature and the second portion 214B of the asymmetrical cross-section has a non-spherical curvature.

In contrast, however, to the housing 208 depicted in FIG. 2B, the second portion 214B of the housing 214 is more elongated than the second portion 208B of the housing 208. The more pronounced elongation of the second portion 214B of the housing 214 as compared to the second portion 208B of the housing 208 results in an even greater reduction in the air resistance experienced by the housing 214 as compared to the housing 208. In particular, in example embodiments, air flow 216 may travel past an exterior surface of the aerodynamically enhanced sensor housing 214. Similar to the housing 208 depicted in FIG. 2B, due to the asymmetrical configuration of the housing 214 according to which the housing 214 includes a first portion 214A that has a spherical curvature and a second portion 214B that has a non-spherical curvature, the air flow 216 experiences significantly less disruption as it travels past the housing 214 as compared to the conventional sensor housing 202, for example.

Due, however, to the greater extent of elongation of the second portion 214B of the housing 214 as compared to the second portion 208B of the housing 208, the air flow 216 experiences even less disruption than the air flow 210, and thus, deflected air flow 218 experiences less turbulent air flow than deflected air flow 212. As a result, the air resistance experienced by the housing 214 is even further reduced as compared to the housing 208. In example embodiments, the aerodynamically enhanced properties of the housing 214, in particular the even greater elongation of the second portion 214B of the housing 214 can result in a greater than 50% reduction in air resistance as compared to the housing 208, which exhibits a less pronounced elongation of its second portion 208B. In example embodiments, the extent of elongation of the second portion 214B of the housing 214, for example, may be inversely proportional to the drag reducing effect on the housing 214. More specifically, in some example embodiments, the greater the degree of elongation of the second portion 208B (e.g., the greater the length of the elongated portion), the greater the reduction in air resistance/drag forces experienced by the sensor housing, and thus, the greater the improvement in fuel consumption for the vehicle.

Figure 3A:
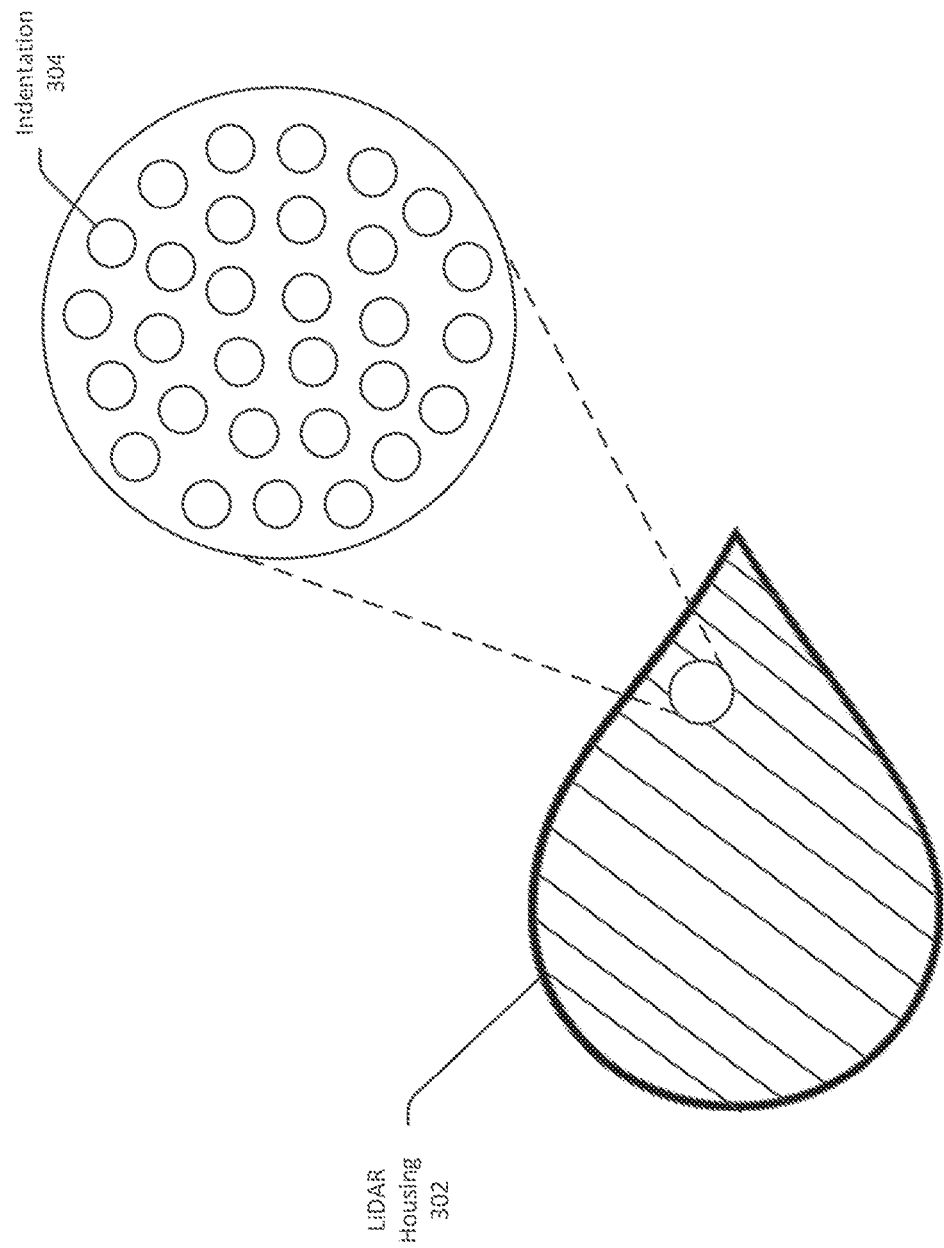
FIG. 3A illustrates an example configuration of indentations on a surface of an aerodynamically enhanced sensor housing in accordance with an example embodiment of the invention.

In example embodiments, an aerodynamically enhanced sensor housing may include additional features that provide even greater reduction in drag/air resistance. For instance, in example embodiments, one or more indentations may be formed in an exterior surface of an aerodynamically enhanced sensor housing. FIG. 3A illustrates an example configuration of indentations on a surface of an aerodynamically enhanced sensor housing in accordance with an example embodiment of the invention.

An example sensor housing 302 is depicted in FIG. 3A. The sensor housing 302 may represent sensor housing 208 or sensor housing 214, for example. In an example embodiment, multiple indentations 304 are formed in an exterior surface of the sensor housing 302. An example arrangement of the indentations is shown for a small portion of the exterior surface of the sensor housing 302 in FIG. 3A. As depicted, the indentations 304 may have an arrangement in which each indentation 304 is substantially equidistant from each neighboring indentation 304. Moreover, in some example embodiments, the indentations 304 may be formed so as to provide substantially complete coverage over an entire exterior surface of the housing 302. In other example embodiments, the indentations 304 may be exclusively (or substantially) formed only on a portion of the exterior surface of the housing 302 that exhibits the substantially spherical curvature.

The indentations 304 may have any suitable shape/configuration. For instance, the indentations 304 may be grooves, dimples, wedges, or the like. In example embodiments, the indentations 304 may have substantially the same size. For instance, in some example embodiments, each indentation 304 may have substantially the same depth, width, and radius of curvature. In other example embodiments, two or more of the indentations 304 may vary in depth, width, and/or radius of curvature.

Figure 3B:
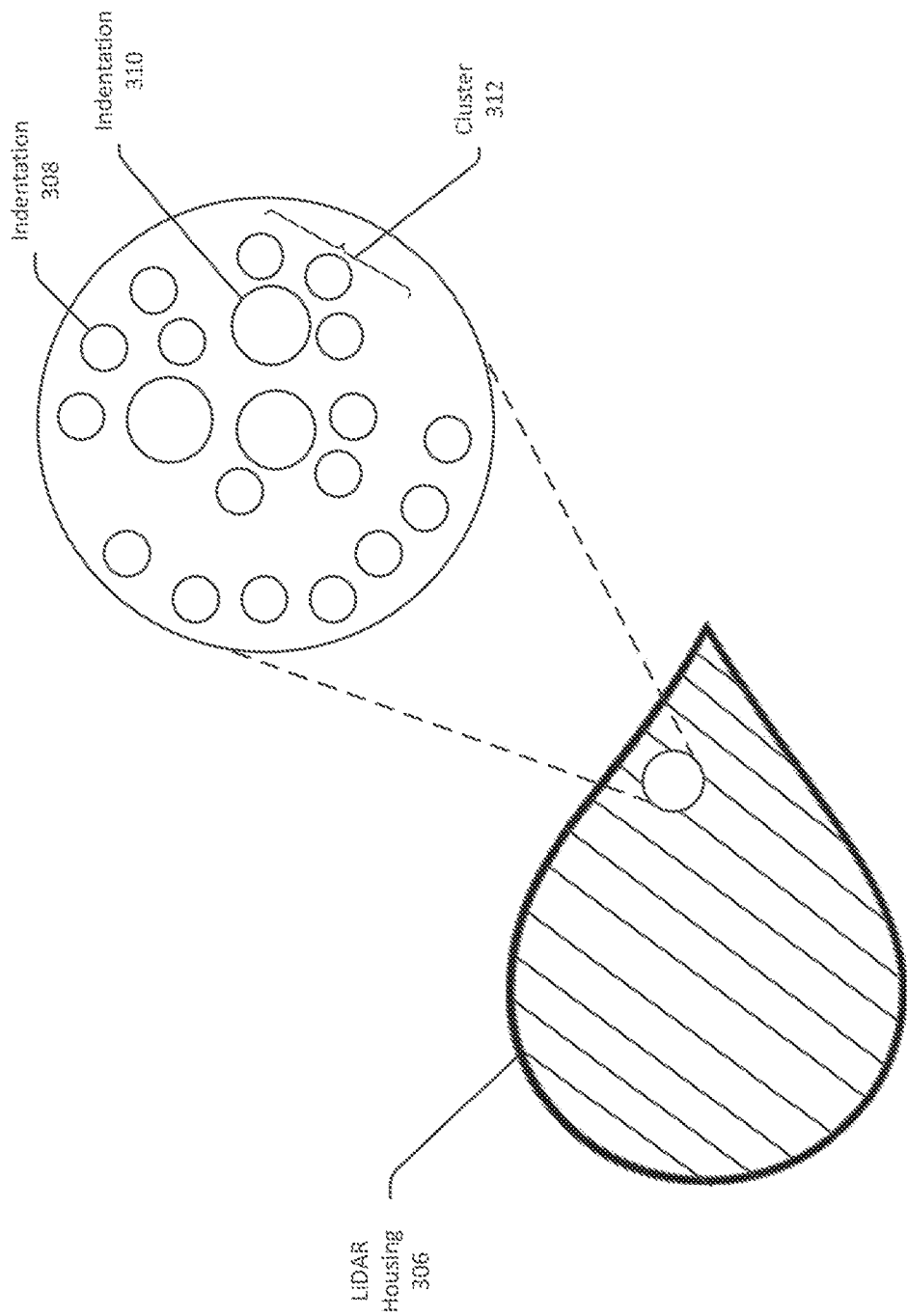
FIG. 3B illustrates another example configuration of indentations on a surface of an aerodynamically enhanced sensor housing in accordance with another example embodiment of the invention.

FIG. 3B illustrates another example configuration of indentations on a surface of an aerodynamically enhanced sensor housing in accordance with another example embodiment of the invention. An example sensor housing 306 is depicted in FIG. 3B. The sensor housing 306 may represent sensor housing 208 or sensor housing 214, for example. An example arrangement of the indentations is shown for a small portion of the exterior surface of the sensor housing 306 in FIG. 3B. As depicted, multiple indentations are formed on an exterior surface of the housing 306. In example embodiments, the indentations may include one or more indentations 308 and one or more indentations 310. In example embodiments, the indentation(s) 308 may have a smaller depth, a smaller width, and/or a smaller radius of curvature than the indentation(s) 310.

Further, in some example embodiments, the indentations may be formed as a set of clusters 312, where each cluster 312 includes a indentation 310 having the greater depth, width, and/or radius of curvature surrounded, at least in part, by two or more indentations 308 have the smaller depth, width, and/or radius of curvature. In example embodiments, the presence of indentations 308, 310 having different sizes may serve to enhanced the drag reducing characteristics of the aerodynamically enhanced sensor housing 306. In addition, in some example embodiments, the indentations 308, 310 may be formed in a sparse arrangement according to which the level of coverage of an exterior surface of the housing 306 by the indentations may be less than a threshold percentage of coverage. In other example embodiments, the extent of coverage and/or the number indentation clusters may be increased if, for example, a greater drag reducing effect is desired.

Figure 4:
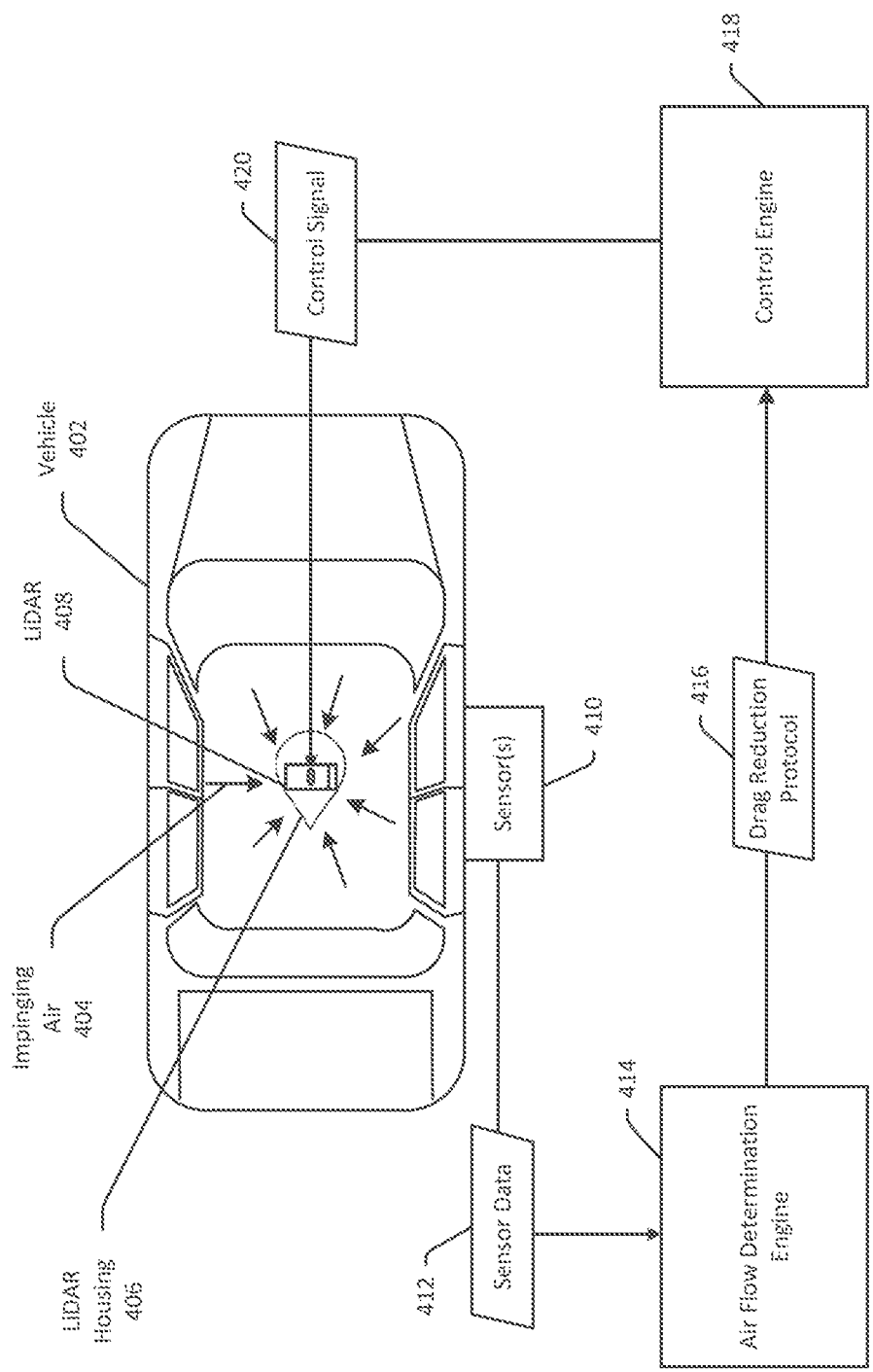
FIG. 4 is a data flow and block diagram illustrating generation and implementation of a drag reduction protocol designed to modify air flow characteristics of air impinging on an aerodynamically enhanced sensor housing in accordance with an example embodiment of the invention.
Figure 5:
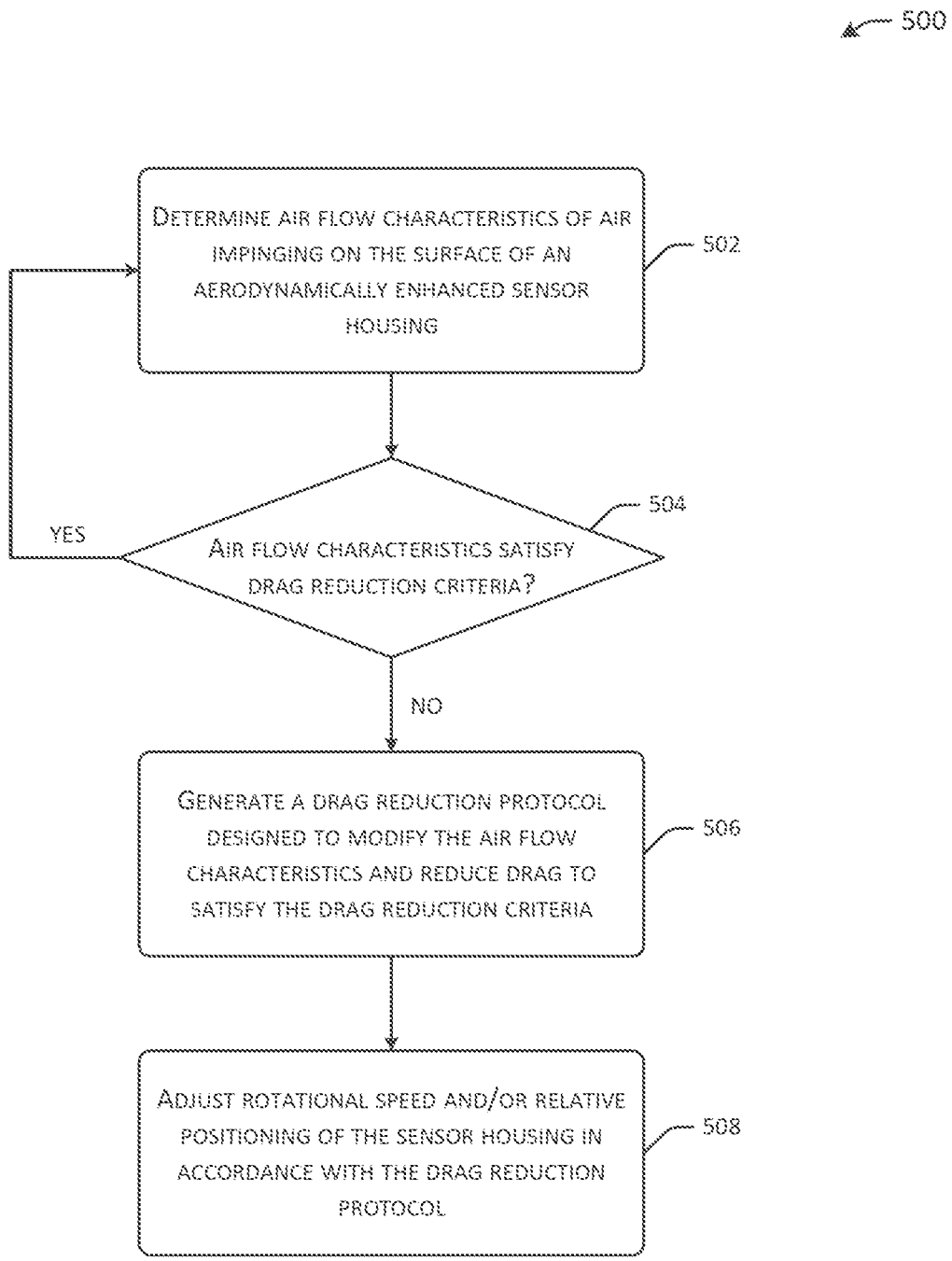
FIG. 5 is a process flow diagram of an illustrative method for generating and implementing a drag reduction protocol designed to modify air flow characteristics of air impinging on an aerodynamically enhanced sensor housing in accordance with an example embodiment of the invention.

FIG. 4 is a data flow and block diagram illustrating generation and implementation of a drag reduction protocol designed to modify air flow characteristics of air impinging on an aerodynamically enhanced sensor housing in accordance with an example embodiment of the invention. FIG. 5 is a process flow diagram of an illustrative method 500 for implementing the process of FIG. 4. FIGS. 4 and 5 will be described in conjunction with one another hereinafter.

Each operation of the method 500 can be performed by one or more of the engines/program modules depicted in FIGS. 4 and 6, whose operation will be described in more detail hereinafter. These engines/program modules can be implemented in any combination of hardware, software, and/or firmware. In certain example embodiments, one or more of these engines/program modules can be implemented, at least in part, as software and/or firmware modules that include computer-executable instructions that when executed by a processing circuit cause one or more operations to be performed. In example embodiments, these engines/program modules may be customized computer-executable logic implemented within a customized computing machine such as a customized FPGA or ASIC. A system or device described herein as being configured to implement example embodiments of the invention can include one or more processing circuits, each of which can include one or more processing units or cores. Computer-executable instructions can include computer-executable program code that when executed by a processing core can cause input data contained in or referenced by the computer-executable program code to be accessed and processed by the processing core to yield output data.

Referring first to FIG. 4, a vehicle 402 is depicted. The vehicle 402 may be, for example, a driverless or autonomous vehicle. In some example embodiments, even if the vehicle 402 is an autonomous vehicle, one or more vehicle occupants may nonetheless may be present for safety reasons. For instance, a safety driver may be present in the vehicle 402 to override software functions of the vehicle 402 if necessary. As previously described, various sensors/sensor assembly apparatuses may be provided onboard the vehicle 402. For instance, a LiDAR 408 may be provided. The LiDAR sensor 408 may be provided within a housing 406. The housing 406 may have an aerodynamically enhanced shape/configuration and/or surface features as described herein in connection with example embodiments of the invention. As previously noted, the LiDAR 408 may form part of a larger sensor assembly. For example, one or more other types of sensors may be provided within the same housing 406.

In example embodiments, the LiDAR 408 may be provided on an exterior of the vehicle 402. For example, the LiDAR 408 may be provided centrally on a roof of the vehicle 402. In this position, the LiDAR housing 406 may exhibit more air resistance than if the LiDAR 408 was provided at other exterior surfaces of the vehicle 402. In example embodiments, air 404 may continuously impinge on the housing 406 from various directions as the vehicle 402 is operated. In example embodiments, the portion of the housing 406 having a substantially spherical curvature may experience more air impingement than the portion of the housing 406 having the non-spherical curvature, and thus, more air resistance assuming that the portion of the housing 406 with the spherical curvature is aligned with a forward direction of travel of the vehicle 402.

Referring now to FIG. 4 in conjunction with FIG. 5, at block 502 of the method 500, an air flow determination engine 414 may determine air flow characteristics of the air 404 impinging on an exterior surface of the housing 406. More specifically, one or more sensors 410 may be provided onboard the vehicle 402. The sensor(s) 410 may include force sensors, inertial sensors, or the like. The sensor(s) 410 may be configured to capture sensor data 412 indicative of air flow characteristics of the impinging air 404. In example embodiments, the air flow characteristics include at least one of a level of air flow disruption of the impinging air 404 on one or more portions of the exterior surface of the housing 406, a direction of impingement of the impinging air 404, or the like.

At block 504 of the method 500, the air flow determination engine 414 may determine whether the air flow characteristics satisfy one or more drag reduction criteria. In response to a positive determination at block 504, the method 500 may again proceed iteratively from block 502. In other example embodiments, however, the air flow determination engine 414 may make a negative determination at block 504. For instance, in example embodiments, determining that the air flow characteristics fail to satisfy one or more drag reduction criteria includes determining that the level of air flow disruption is greater than a threshold level of permissible air flow disruption. In another example embodiment, determining that the air flow characteristics fail to satisfy one or more drag reduction criteria includes determining that the direction of impingement of the impinging air exceeds a threshold angle.

In response to a negative determination at block 504, the method 500 may proceed to block 506, where the air flow determination engine 414 may generate a drag reduction protocol 416 designed to modify the air flow characteristics and reduce the drag on the sensor housing 406 to satisfy the one or more drag reduction criteria. In example embodiments, the air flow determination engine 414 may generate the drag reduction protocol by determining at least one of a modified rotational speed of the sensor housing 406 or a modified relative positioning of the sensor housing 406 with respect to a reference point on the vehicle (e.g., a point located at a front-center location of the vehicle 402) to reduce the drag on the sensor housing 406.

In example embodiments, the air flow determination engine 414 may send an indication of the drag reduction protocol 416 to a control engine 418. Then, at block 508 of the method 500, the control engine 418 may send a control signal 420 to implement the drag reduction protocol 416. More specifically, in example embodiments, the control engine 418 may control the LiDAR 408 to adjust a rotational speed and/or a relative positioning of the housing 406 in relation to the vehicle 402 in accordance with the drag reduction protocol 416 in order to modify the air flow characteristics and reduce drag on the housing 406.

In example embodiments, the methods illustrated in FIG. 4 and FIG. 5, as applied to the LiDAR 408 with the housing 406, may be implemented in conjunction with the sensor housing 202 of FIG. 2A, the sensor housing 208 of FIG. 2B, the sensor housing 214 of FIG. 2C, the sensor housing 302 of FIG. 3A, and/or the sensor housing 306 of FIG. 3B. In some example embodiments, the control engine 418 may adjust or change a number and/or pattern of the indentations 304, and/or change radii of curvature of one or more of the individual indentations 304, as shown in FIG. 3A, based on air flow characteristics or changes in air flow characteristics. For instance, if a wind speed increases, the control engine 418 may increase a number of the indentations 304, and/or increase radii of one or more of the individual indentations 304.

Hardware Implementation

Figure 6:
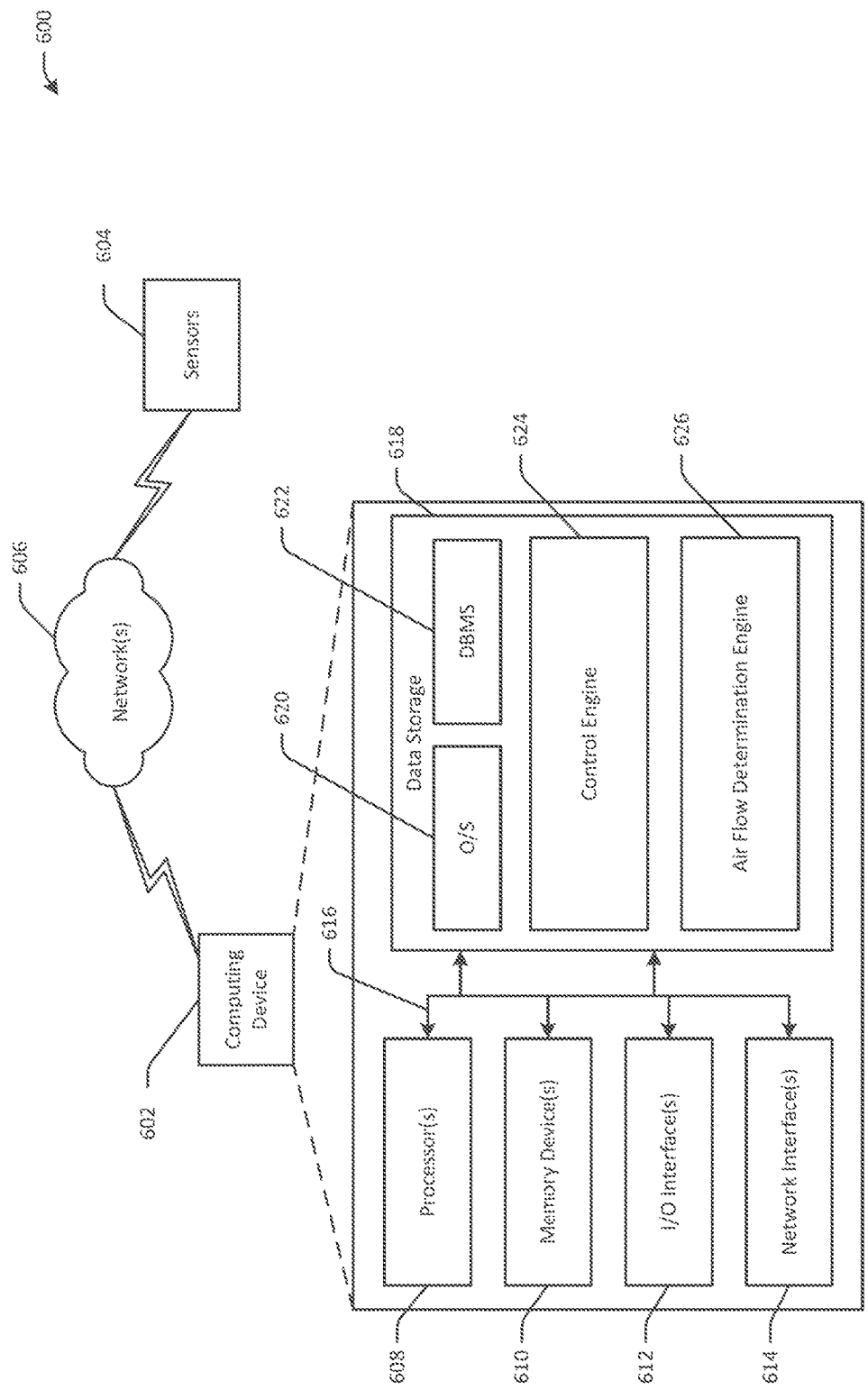
FIG. 6 is a schematic block diagram illustrating an example networked architecture configured to implement example embodiments of the invention.

FIG. 6 is a schematic block diagram illustrating an example networked architecture 600 configured to implement example embodiments of the invention. The networked architecture 600 can include one or more special-purpose computing devices 602 communicatively coupled via one or more networks 604 to various sensors 604. The sensors 604 may include any of the example types of on-board vehicle sensors previously described including, without limitation, LiDAR sensors, radars, cameras, GPS receivers, sonar-based sensors, ultrasonic sensors, IMUs, accelerometers, gyroscopes, magnetometers, FIR sensors, and so forth. In example embodiments, the sensors 604 may include on-board sensors provided on an exterior or in an interior of a vehicle such as an autonomous vehicle. The special-purpose computing device(s) 602 may include devices that are integrated with a vehicle and may receive sensor data from the sensors 604 via a local network connection (e.g., WiFi, Bluetooth, Dedicated Short Range Communication (DSRC), or the like). In other example embodiments, the special-purpose computing device(s) 602 may be provided remotely from a vehicle and may receive the sensor data from the sensors 604 via one or more long-range networks.

The special-purpose computing device(s) 602 may be hard-wired to perform the techniques; may include circuitry or digital electronic devices such as one or more ASICs or FPGAs that are persistently programmed to perform the techniques; and/or may include one or more hardware processors programmed to perform the techniques pursuant to program instructions in firmware, memory, other storage, or a combination thereof. The special-purpose computing device(s) 602 may also combine custom hard-wired logic, ASICs, or FPGAs with custom programming to accomplish the techniques. The special-purpose computing device(s) 602 may be desktop computer systems, server computer systems, portable computer systems, handheld devices, networking devices or any other device or combination of devices that incorporate hard-wired and/or programmed logic to implement the techniques.

The special-purpose computing device(s) may be generally controlled and coordinated by operating system software 620, such as iOS, Android, Chrome OS, Windows XP, Windows Vista, Windows 6, Windows 8, Windows Server, Windows CE, Unix, Linux, SunOS, Solaris, iOS, Blackberry OS, VxWorks, or other compatible operating systems. In other embodiments, the computing device(s) 602 may be controlled by a proprietary operating system. The operating system software 620 may control and schedule computer processes for execution; perform memory management; provide file system, networking, and I/O services; and provide user interface functionality, such as a graphical user interface ("GUI").

While the computing device(s) 602 and/or the sensors 604 may be described herein in the singular, it should be appreciated that multiple instances of any such component can be provided and functionality described in connection any particular component can be distributed across multiple instances of such a component. In certain example embodiments, functionality described herein in connection with any given component of the architecture 600 can be distributed among multiple components of the architecture 600. For example, at least a portion of functionality described as being provided by a computing device 602 may be distributed among multiple such computing devices 602.

The network(s) 604 can include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. The network(s) 604 can have any suitable communication range associated therewith and can include, for example, global networks (e.g., the Internet), metropolitan area networks (MANs), wide area networks (WANs), local area networks (LANs), or personal area networks (PANs). In addition, the network(s) 604 can include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the computing device 602 can include one or more processors (processor(s)) 608, one or more memory devices 610 (generically referred to herein as memory 610), one or more input/output ("I/O") interface(s) 612, one or more network interfaces 616, and data storage 618. The computing device 602 can further include one or more buses 616 that functionally couple various components of the computing device 602. The data storage may store one or more engines, program modules, components, or the like including, without limitation, an air flow determination engine 626 and a control engine 624. Each of the engines/components depicted in FIG. 6 may include logic for performing any of the processes or tasks described earlier in connection with correspondingly named engines/components. In certain example embodiments, any of the depicted engines/components may be implemented in hard-wired circuitry within digital electronic devices such as one or more ASICs or FPGAs that are persistently programmed to perform corresponding techniques.

The bus(es) 616 can include at least one of a system bus, a memory bus, an address bus, or a message bus, and can permit the exchange of information (e.g., data (including computer-executable code), signaling, etc.) between various components of the computing device 602. The bus(es) 616 can include, without limitation, a memory bus or a memory controller, a peripheral bus, an accelerated graphics port, and so forth. The bus(es) 616 can be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

The memory 610 can include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, can include non-volatile memory. In certain example embodiments, volatile memory can enable faster read/write access than non-volatile memory. However, in certain other example embodiments, certain types of non-volatile memory (e.g., FRAM) can enable faster read/write access than certain types of volatile memory.

In various implementations, the memory 610 can include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 610 can include main memory as well as various forms of cache memory such as instruction cache(s), data cache(s), translation lookaside buffer(s) (TLBs), and so forth. Further, cache memory such as a data cache can be a multi-level cache organized as a hierarchy of one or more cache levels (L1, L2, etc.). In example embodiments, the memory 610 may include the data storage 106(1)-106(P) and/or the data storage 120 depicted in FIG. 1. Alternatively, the data storage 106(1)-106(P) may be hard disk storage forming part of the data storage 618 and/or the data storage 120 may be a form of RAM or cache memory that is provided as part of the FOV semantics computing machine 626 itself.

The data storage 618 can include removable storage and/or non-removable storage including, but not limited to, magnetic storage, optical disk storage, and/or tape storage. The data storage 618 can provide non-volatile storage of computer-executable instructions and other data. The memory 610 and the data storage 618, removable and/or non-removable, are examples of computer-readable storage media (CRSM) as that term is used herein. The data storage 618 can store computer-executable code, instructions, or the like that can be loadable into the memory 610 and executable by the processor(s) 608 to cause the processor(s) 608 to perform or initiate various operations. The data storage 618 can additionally store data that can be copied to memory 610 for use by the processor(s) 608 during the execution of the computer-executable instructions. Moreover, output data generated as a result of execution of the computer-executable instructions by the processor(s) 608 can be stored initially in memory 610 and can ultimately be copied to data storage 618 for non-volatile storage.

More specifically, the data storage 618 can store one or more operating systems (O/S) 620 and one or more database management systems (DBMS) 622 configured to access the memory 610 and/or one or more external datastore(s) (not depicted) potentially via one or more of the networks 604. In addition, the data storage 618 may further store one or more program modules, applications, engines, computer-executable code, scripts, or the like. For instance, any of the engines/components depicted in FIG. 6 may be implemented as software and/or firmware that includes computer-executable instructions (e.g., computer-executable program code) loadable into the memory 610 for execution by one or more of the processor(s) 608 to perform any of the techniques described herein.

Although not depicted in FIG. 6, the data storage 618 can further store various types of data utilized by engines/components of the computing device 602. Such data may include, without limitation, sensor data, feedback data including historical sensor operational data, initial parameter data, or the like. Any data stored in the data storage 618 can be loaded into the memory 610 for use by the processor(s) 608 in executing computer-executable program code. In addition, any data stored in the data storage 618 can potentially be stored in one or more external datastores that are accessible via the DBMS 622 and loadable into the memory 610 for use by the processor(s) 608 in executing computer-executable instructions/program code.

The processor(s) 608 can be configured to access the memory 610 and execute computer-executable instructions/program code loaded therein. For example, the processor(s) 608 can be configured to execute computer-executable instructions/program code of the various engines/components of the FOV semantics computing machine 626 to cause or facilitate various operations to be performed in accordance with one or more embodiments of the invention. The processor(s) 608 can include any suitable processing unit capable of accepting data as input, processing the input data in accordance with stored computer-executable instructions, and generating output data. The processor(s) 608 can include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 608 can have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 608 can be made capable of supporting any of a variety of instruction sets.

Referring now to other illustrative components depicted as being stored in the data storage 618, the 0/S 620 can be loaded from the data storage 618 into the memory 610 and can provide an interface between other application software executing on the computing device 602 and hardware resources of the computing device 602. More specifically, the 0/S 620 can include a set of computer-executable instructions for managing hardware resources of the computing device 602 and for providing common services to other application programs. In certain example embodiments, the 0/S 620 can include or otherwise control execution of one or more of the engines/program modules stored in the data storage 618. The O/S 620 can include any operating system now known or which can be developed in the future including, but not limited to, any server operating system, any mainframe operating system, or any other proprietary or non-proprietary operating system.

The DBMS 622 can be loaded into the memory 610 and can support functionality for accessing, retrieving, storing, and/or manipulating data stored in the memory 610, data stored in the data storage 618, and/or data stored in external datastore(s). The DBMS 622 can use any of a variety of database models (e.g., relational model, object model, etc.) and can support any of a variety of query languages. The DBMS 622 can access data represented in one or more data schemas and stored in any suitable data repository. Datastore(s) that may be accessible by the computing device 602 via the DBMS 622, can include, but are not limited to, databases (e.g., relational, object-oriented, etc.), file systems, flat files, distributed datastores in which data is stored on more than one node of a computer network, peer-to-peer network datastores, or the like.

Referring now to other illustrative components of the computing device 602, the input/output (I/O) interface(s) 612 can facilitate the receipt of input information by the computing device 602 from one or more I/O devices as well as the output of information from the computing device 602 to the one or more I/O devices. The I/O devices can include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components can be integrated into the computing device 602 or can be separate therefrom. The I/O devices can further include, for example, any number of peripheral devices such as data storage devices, printing devices, and so forth.

The I/O interface(s) 612 can also include an interface for an external peripheral device connection such as universal serial bus (USB), FireWire, Thunderbolt, Ethernet port or other connection protocol that can connect to one or more networks. The I/O interface(s) 612 can also include a connection to one or more antennas to connect to one or more networks via a wireless local area network (WLAN) (such as Wi-Fi) radio, Bluetooth, and/or a wireless network radio, such as a radio capable of communication with a wireless communication network such as a Long Term Evolution (LTE) network, WiMAX network, 3G network, etc.

The computing device 602 can further include one or more network interfaces 616 via which the computing device 602 can communicate with any of a variety of other systems, platforms, networks, devices, and so forth. The network interface(s) 616 can enable communication, for example, with the sensors 604 and/or one or more other devices via one or more of the network(s) 604. In example embodiments, the network interface(s) 616 provide a two-way data communication coupling to one or more network links that are connected to one or more of the network(s) 604. For example, the network interface(s) 616 may include an integrated services digital network (ISDN) card, a cable modem, a satellite modem, or a modem to provide a data communication connection to a corresponding type of telephone line. As another non-limiting example, the network interface(s) 616 may include a local area network (LAN) card to provide a data communication connection to a compatible LAN (or a wide area network (WAN) component to communicate with a WAN). Wireless links may also be implemented. In any such implementation, the network interface(s) 616 may send and receive electrical, electromagnetic, or optical signals that carry digital data streams representing various types of information.

A network link typically provides data communication through one or more networks to other data devices. For example, a network link may provide a connection through a local network to a host computer or to data equipment operated by an Internet Service Provider (ISP). The ISP, in turn, may provide data communication services through the world wide packet data communication network now commonly referred to as the "Internet". Local networks and the Internet both use electrical, electromagnetic, or optical signals that carry digital data streams. The signals through the various network(s) 604 and the signals on network links and through the network interface(s) 616, which carry the digital data to and from the computing device 602, are example forms of transmission media. In example embodiments, the computing device 602 can send messages and receive data, including program code, through the network(s) 604, network links, and network interface(s) 616. For instance, in the Internet example, a server might transmit a requested code for an application program through the Internet, the ISP, a local network, and a network interface 616. The received code may be executed by a processor 608 as it is received, and/or stored in the data storage 618, or other non-volatile storage for later execution.

It should be appreciated that the engines depicted in FIG. 6 as part of the computing device 602 are merely illustrative and not exhaustive. In particular, functionality can be modularized in any suitable manner such that processing described as being supported by any particular engine can alternatively be distributed across multiple engines, program modules, components, or the like, or performed by a different engine, program module, component, or the like. Further, one or more depicted engines may or may not be present in certain embodiments, while in other embodiments, additional engines not depicted can be present and can support at least a portion of the described functionality and/or additional functionality. In addition, various engine(s), program module(s), script(s), plug-in(s), Application Programming Interface(s) (API(s)), or any other suitable computer-executable code hosted locally on the computing device 602 and/or hosted on other computing device(s) (e.g., 602) accessible via one or more of the network(s) 602, can be provided to support functionality provided by the engines depicted in FIG. 6 and/or additional or alternate functionality. In addition, engines that support functionality described herein can be implemented, at least partially, in hardware and/or firmware and can be executable across any number of computing devices 602 in accordance with any suitable computing model such as, for example, a client-server model, a peer-to-peer model, and so forth.

It should further be appreciated that the computing device 602 can include alternate and/or additional hardware, software, and/or firmware components beyond those described or depicted without departing from the scope of the invention. More particularly, it should be appreciated that software, firmware, and/or hardware components depicted as forming part of the computing device 602 are merely illustrative and that some components may or may not be present or additional components may be provided in various embodiments. It should further be appreciated that each of the engines depicted and described represent, in various embodiments, a logical partitioning of supported functionality. This logical partitioning is depicted for ease of explanation of the functionality and may or may not be representative of the structure of software, hardware, and/or firmware for implementing the functionality.

In general, the terms engine, program module, or the like, as used herein, refer to logic embodied in hardware, firmware, and/or circuitry, or to a collection of software instructions, possibly having entry and exit points, written in a programming language, such as, for example, Java, C or C++. A software engine/module may be compiled and linked into an executable program, installed in a dynamic link library, or may be written in an interpreted programming language such as, for example, BASIC, Perl, or Python. It will be appreciated that software engines/modules may be callable from other engines/modules or from themselves, and/or may be invoked in response to detected events or interrupts.

Software engines/modules configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. "Open source" software refers to source code that can be distributed as source code and/or in compiled form, with a well-publicized and indexed means of obtaining the source, and optionally with a license that allows modifications and derived works. Software instructions may be embedded in firmware and stored, for example, on flash memory such as erasable programmable read-only memory (EPROM). It will be further appreciated that hardware modules/engines may include connected logic units, such as gates and flip-flops, and/or may be further include programmable units, such as programmable gate arrays or processors.

Example embodiments are described herein as including engines or program modules. Such engines/program modules may constitute either software engines (e.g., code embodied on a machine-readable medium) or hardware engines. A "hardware engine" is a tangible unit capable of performing certain operations and may be configured or arranged in a certain physical manner. In various example embodiments, one or more computer systems (e.g., a standalone computer system, a client computer system, or a server computer system) or one or more hardware engines of a computer system (e.g., a processor or a group of processors) may be configured by software (e.g., an application or application portion) as a hardware engine that operates to perform certain operations as described herein.

In some embodiments, a hardware engine may be implemented mechanically, electronically, or any suitable combination thereof. For example, a hardware engine may include dedicated circuitry or logic that is permanently configured to perform certain operations. For example, a hardware engine may be a special-purpose processor, such as a field programmable gate array (FPGA) or an application specific integrated circuit (ASIC). A hardware engine may also include programmable logic or circuitry that is temporarily configured by software to perform certain operations. For example, a hardware engine may include a general-purpose processor or other programmable processor configured by software, in which case, the configured processor becomes a specific machine uniquely tailored to perform the configured functions and no longer constitute general-purpose processors. It will be appreciated that the decision to implement a hardware engine mechanically, in dedicated and permanently configured circuitry, or in temporarily configured circuitry (e.g., configured by software) may be driven by cost and time considerations.

Accordingly, the term "engine" or "program module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware engines are temporarily configured (e.g., programmed), each of the hardware engines need not be configured or instantiated at any one instance in time. For example, where a hardware engine includes a general-purpose processor configured by software to become a special-purpose processor, the general-purpose processor may be configured as respectively different special-purpose processors (e.g., comprising different hardware engines) at different times. Software accordingly can configure a particular processor or processors, for example, to constitute a particular hardware engine at a given instance of time and to constitute a different hardware engine at a different instance of time.

Hardware engines can provide information to, and receive information from, other hardware engines. Accordingly, the described hardware engines may be regarded as being communicatively coupled. Where multiple hardware engines exist contemporaneously, communications may be achieved through signal transmission (e.g., over appropriate circuits and buses) between or among two or more of the hardware engines. In embodiments in which multiple hardware engines are configured or instantiated at different times, communications between such hardware engines may be achieved, for example, through the storage and retrieval of information in memory structures to which the multiple hardware engines have access. For example, one hardware engine may perform an operation and store the output of that operation in a memory device to which it is communicatively coupled. A further hardware engine may then, at a later time, access the memory device to retrieve and process the stored output. Hardware engines may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute an implementation of a hardware engine. Similarly, the methods described herein may be at least partially processor-implemented, with a particular processor or processors being an example of hardware. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API).

The performance of certain of the operations of example methods described herein may be distributed among multiple processors, not only residing within a single machine, but deployed across a number of machines. In some example embodiments, the processors may be located in a single geographic location (e.g., within a home environment, an office environment, or a server farm). In other example embodiments, the processors may be distributed across a number of geographic locations.

The present invention may be implemented as a system, a method, and/or a computer program product. The computer program product may include a computer readable storage medium (or media) having computer readable program instructions embodied thereon for causing a processor to carry out aspects of the present invention.

The computer readable storage medium is a form of non-transitory media, as that term is used herein, and can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. The computer readable storage medium, and non-transitory media more generally, may include non-volatile media and/or volatile media. A non-exhaustive list of more specific examples of a computer readable storage medium includes the following: a portable computer diskette such as a floppy disk or a flexible disk; a hard disk; a random access memory (RAM), a read-only memory (ROM), an erasable programmable read-only memory (EPROM or Flash memory), a static random access memory (SRAM), or any other memory chip or cartridge; a portable compact disc read-only memory (CD-ROM); a digital versatile disk (DVD); a memory stick; a solid state drive; magnetic tape or any other magnetic data storage medium; a mechanically encoded device such as punch-cards or raised structures in a groove having instructions recorded thereon or any physical medium with patterns of holes; any networked versions of the same; and any suitable combination of the foregoing.

Non-transitory media is distinct from transmission media, and thus, a computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Non-transitory media, however, can operate in conjunction with transmission media. In particular, transmission media may participate in transferring information between non-transitory media. For example, transmission media can include coaxial cables, copper wire, and/or fiber optics, including the wires that include at least some of the bus(es) 602. Transmission media can also take the form of acoustic or light waves, such as those generated during radio-wave and infra-red data communications.

Computer readable program instructions described herein can be downloaded to respective computing/processing devices from a computer readable storage medium or to an external computer or external storage device via a network, for example, the Internet, a local area network (LAN), a wide area network (WAN), and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider (ISP)). In some embodiments, electronic circuitry including, for example, programmable logic circuitry, FPGAs, or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The various features and processes described above may be used independently of one another or may be combined in various ways. All possible combinations and sub-combinations are intended to fall within the scope of the invention. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

The flowchart and block diagrams in the Figures illustrate the architecture, functionality, and operation of possible implementations of systems, methods, and computer program products according to various embodiments of the invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed partially, substantially, or entirely concurrently, or the blocks may sometimes be executed in the reverse order, depending upon the functionality involved.

It should be emphasized that many variations and modifications may be made to the above-described embodiments, the elements of which are to be understood as being among other example embodiments of the invention. All such modifications and variations are intended to be included herein within the scope of the invention. While example embodiments of the invention may be referred to herein, individually or collectively, by the term "invention," this is merely for convenience and does not limit the scope of the invention to any single disclosure or concept if more than one is, in fact, disclosed. The foregoing description details certain embodiments of the invention. It will be appreciated, however, that no matter how detailed the foregoing appears in text, the invention can be practiced in many ways. It should be noted that the use of particular terminology when describing certain features or aspects of the invention should not be taken to imply that the terminology is being redefined herein to be restricted to including any specific characteristics of the features or aspects of the invention with which that terminology is associated.

The embodiments illustrated herein are described in sufficient detail to enable those skilled in the art to practice the teachings disclosed. Other embodiments may be used and derived therefrom, such that structural and logical substitutions and changes may be made without departing from the scope of the invention. The Detailed Description, therefore, is not to be taken in a limiting sense, and the scope of various embodiments is defined only by the appended claims, along with the full range of equivalents to which such claims are entitled.

Although the invention(s) have been described in detail for the purpose of illustration based on what is currently considered to be the most practical and preferred implementations, it is to be understood that such detail is solely for that purpose and that the invention is not limited to the disclosed implementations, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

As used herein, the term "or" may be construed in either an inclusive or exclusive sense. Moreover, plural instances may be provided for resources, operations, or structures described herein as a single instance. Additionally, boundaries between various resources, operations, program modules, engines, and/or datastores are somewhat arbitrary, and particular operations are illustrated in a context of specific illustrative configurations. Other allocations of functionality are envisioned and may fall within a scope of various embodiments of the invention. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the invention as represented by the appended claims. The specification and drawings are, accordingly, to be regarded in an illustrative rather than a restrictive sense.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. In addition, it should be appreciated that any operation, element, component, data, or the like described herein as being based on another operation, element, component, data, or the like can be additionally based on one or more other operations, elements, components, data, or the like. Accordingly, the phrase "based on," or variants thereof, should be interpreted as "based at least in part on."

What is claimed is:

1. A computer-implemented method for reducing drag on a sensor housing, the method comprising:
    determining air flow characteristics of air impinging on an exterior surface of the sensor housing;
    determining that the air flow characteristics fail to satisfy one or more drag reduction criteria;
    generating a drag reduction protocol designed to modify the air flow characteristics and reduce the drag on the sensor housing to satisfy the one or more drag reduction criteria; and
    implementing the drag reduction protocol.

2. The computer-implemented method of claim 1, wherein the air flow characteristics comprise at least one of a level of air flow disruption of the impinging air on one or more portions of the exterior surface of the sensor housing or a direction of impingement of the impinging air.

3. The computer-implemented method of claim 2, wherein determining that the air flow characteristics fail to satisfy one or more drag reduction criteria comprises determining the level of air flow disruption is greater than a threshold level of permissible air flow disruption.

4. The computer-implemented method of claim 2, wherein determining that the air flow characteristics fail to satisfy one or more drag reduction criteria comprises determining that the direction of impingement of the impinging air exceeds a threshold angle.

5. The computer-implemented method of claim 1, wherein generating the drag reduction protocol comprises determining at least one of a modified rotational speed of the sensor housing or a modified relative positioning of the sensor housing with respect to a reference point on the vehicle to reduce the drag on the sensor housing.

6. The computer-implemented method of claim 1, wherein the sensor housing comprises an asymmetrical lateral cross-section, and wherein the asymmetrical lateral cross-section defines a first portion of the sensor housing having a substantially spherical curvature and a second portion of the sensor housing having a non-spherical curvature.

7. A system for reducing drag on a sensor housing, the system comprising:
    at least one processor; and
    at least one memory storing computer-executable instructions, wherein the at least one processor is configured to access the at least one memory and execute the computer-executable instructions to:
    determine air flow characteristics of air impinging on an exterior surface of the sensor housing;
    determine that the air flow characteristics fail to satisfy one or more drag reduction criteria;
    generate a drag reduction protocol designed to modify the air flow characteristics and reduce the drag on the sensor housing to satisfy the one or more drag reduction criteria; and
    implement the drag reduction protocol.

8. The system of claim 7, wherein the air flow characteristics comprise at least one of a level of air flow disruption of the impinging air on one or more portions of the exterior surface of the sensor housing or a direction of impingement of the impinging air.

9. The system of claim 8, wherein determining that the air flow characteristics fail to satisfy one or more drag reduction criteria comprises at least one of: determining the level of air flow disruption is greater than a threshold level of permissible air flow disruption or determining that the direction of impingement of the impinging air exceeds a threshold angle.

10. The system of claim 7, wherein generating the drag reduction protocol comprises determining at least one of a modified rotational speed of the sensor housing or a modified relative positioning of the sensor housing with respect to a reference point on the vehicle to reduce the drag on the sensor housing.

11. A sensor assembly apparatus comprising:
one or more sensors;
a sensor housing comprising the one or more sensors; and
one or more processors configured to:
determine one or more air flow characteristics of air impinging on an exterior surface of the sensor housing;
determine that the air flow characteristics fail to satisfy one or more drag reduction criteria;
generate a drag reduction protocol designed to modify the one or more air flow characteristics and reduce the drag on the sensor housing to satisfy the one or more drag reduction criteria; and
implement the drag reduction protocol.

12. The sensor assembly apparatus of claim 11, wherein one or more indentations comprise a first indentation surrounded by two indentations each having a smaller depth, width, and radius of curvature compared to a depth, a width, and a radius of curvature of the first indentation.

13. The sensor assembly apparatus of claim 11, wherein:
the sensor housing comprises an asymmetrical lateral cross-section;
the asymmetrical lateral cross-section defines a first portion of the sensor housing having a substantially spherical curvature and a second portion of the housing having a non-spherical curvature;
an exterior surface of the sensor housing comprises one or more indentations formed therein, or the sensor housing is configured to rotate at a rotational speed based on an air flow characteristic associated with air impinging on the exterior surface of the sensor housing; and
the second portion of the sensor housing having the non-spherical curvature comprises an elongated portion that opposes a spherical portion of the first portion of the sensor housing.

14. The sensor assembly apparatus of claim 13, wherein a length of the elongated portion is inversely proportional to an amount of drag on the sensor housing.

15. The sensor assembly apparatus of claim 13, wherein the one or more indentations is a plurality of indentations that provides substantially complete coverage across the exterior surface of the sensor housing.

16. The sensor assembly apparatus of claim 13, wherein the one or more indentations comprise a first indentation and a second indentation, wherein at least one of a width or a depth of the first indentation is greater than a width or a depth of the second indentation.

17. The sensor assembly apparatus of claim 13, wherein the one or more indentations further comprise a first indentation, a second indentation, and a third indentation having substantially the same width and depth as the second indentation, and wherein the second indentation and the third indentation form a cluster around the first indentation.

18. The sensor assembly apparatus of claim 13, wherein the first portion of the sensor housing having the substantially spherical curvature is aligned with a direction of travel.

19. The sensor assembly apparatus of claim 13, wherein the air flow characteristics comprise at least one of a level of air flow disruption of the impinging air on one or more portions of the exterior surface of the sensor housing or a direction of impingement of the impinging air.

* * * * *